(12) United States Patent
Mate (10) Patent No.: US 9,257,951 B2
(45) Date of Patent: Feb. 9, 2016

(54) DIFFERENTIAL AMPLIFIER
(71) Applicant: Red Lion 49 Limited, Begbroke, Oxford (GB)
(72) Inventor: David Joseph Mate, Long Compton (GB)
(73) Assignee: Red Lion 49 Limited, Begbroke, Oxford (GB)
( * ) Notice: Subject to any disclaimer, the term of this patent is extended or adjusted under 35 U.S.C. 154(b) by 303 days.
(21) Appl. No.: 13/891,615
(22) Filed: May 10, 2013
(65) Prior Publication Data
US 2014/0010385 A1  Jan. 9, 2014
(30) Foreign Application Priority Data

May 17, 2012 (GB) .................................. 1208689.8

(51) Int. Cl.
*H03F 99/00* (2009.01)
*H03G 1/00* (2006.01)
*H03F 3/183* (2006.01)
*H03F 3/45* (2006.01)
*H03G 3/00* (2006.01)
(Continued)
(52) U.S. Cl.
CPC ................. *H03G 1/00* (2013.01); *H03F 3/183* (2013.01); *H03F 3/45098* (2013.01);
(Continued)
(58) Field of Classification Search
CPC ............ H03F 3/45071; H03F 3/45179; H03F 3/45183; H03F 3/45475; H03F 3/45085; H03F 3/45928; H03F 3/45632; H03F 3/45188; H03F 3/4565; H03F 3/005; H03F 3/211; H03F 3/45; H03F 3/45511; H03F 3/45645; H03F 3/45654; H03F 3/45659; H03F 3/45748; H03F 3/45941; H03F 3/45973; H03F 3/602; H03F 3/193; H03F 1/3211; H03F 1/34; H03F 1/0205; H03F 1/0216; H03F 1/223; H03F 2203/45466; H03F 2203/45134; H03F 2203/45702; H03F 2203/45418; H03F 2203/45424; H03F 2203/45644; H03F 2203/45138; H03F 2203/45302; H03F 2203/45311; H03F 2203/45512; H03F 2203/45566; H03F 2203/45652; H03F 2203/45078; H03F 2203/45082; H03F 2203/45212; H03F 2203/45244; H03F 2203/45074; H03F 2203/45136; H03F 2203/45151; H03F 2203/45224; H03F 2203/45248; H03F 2203/45288; H03F 2203/45344; H03F 2203/45528; H03F 2200/451; H03F 2200/294; H03F 2200/372; H03F 2200/09; H03F 2200/513; H03F 2200/537; H03F 2200/9103; H03F 2200/129; H03F 2003/4504; H03F 2003/45008; H03G 1/0029; H03G 1/00; H03G 3/3036; H03G 3/3052; H03G 3/30; H04L 25/0276; H04L 27/01; H03D 2200/0033
USPC ........... 381/28, 319, 120, 104, 105, 106, 107, 381/108, 318, 83, 93, 96, 121, 92, 111, 112, 381/113, 114, 115, 26, 122; 700/94; 330/252, 257, 254, 255, 258, 260
See application file for complete search history.

(56) References Cited

U.S. PATENT DOCUMENTS 3,868,583 A 2/1975 Krabbe
5,510,738 A 4/1996 Gorecki et al.
(Continued)

FOREIGN PATENT DOCUMENTS
GB     2457699 A      8/2009

*Primary Examiner* — Leshui Zhang
(74) *Attorney, Agent, or Firm* — Richard M. Goldberg (57) ABSTRACT

An amplifier for amplifying a differential audio signal, having common-mode rejection and digital gain control, includes a current source (401) which supplies a constant level of current to a first current path ($I_1$) and a second current path ($I_2$), and input stage (403) which modulates the current in the current paths in response to a differential input signal, and an output stage (405) which produces an output signal by amplifying the difference in current between the current paths, a degree of feedback provided to the input stage by a feedback stage (402) that modulates the current in the current paths in response to the output signal, and the degree of modulation by the feedback stage is determined by the attenuation provided by at least one multiplying digital-to-analog converter (407) located therein.

19 Claims, 8 Drawing Sheets

(51) Int. Cl.
*H03G 3/30* (2006.01)
*H03G 5/14* (2006.01)

(52) U.S. Cl.
CPC ........ *H03F 3/45502* (2013.01); *H03G 1/0023* (2013.01); *H03G 1/0029* (2013.01); *H03G 3/001* (2013.01); *H03G 3/301* (2013.01); *H03G 5/14* (2013.01); *H03F 2200/411* (2013.01); *H03F 2203/45682* (2013.01)

(56) References Cited

U.S. PATENT DOCUMENTS

| | | | |
|---|---|---|---|
| 6,518,838 B1 * | 2/2003 | Risbo | 330/10 |
| 2009/0167574 A1 | 7/2009 | Liu | |
| 2009/0212865 A1 * | 8/2009 | Mate | 330/258 |
| 2010/0315164 A1 | 12/2010 | Vakilian | |
| 2011/0128080 A1 * | 6/2011 | Wennekers et al. | 331/34 |

* cited by examiner

DIFFERENTIAL AMPLIFIER

CROSS REFERENCE TO RELATED APPLICATIONS

This application claims priority from United Kingdom patent application number 12 08 689.8, filed May 17, 2012, the whole contents of which are incorporated herein by reference in their entirety.

BACKGROUND OF THE INVENTION

1. Field of the Invention

The present invention relates to the amplification of differential audio signals, such as those produced by high-quality microphones.

2. Description of the Related Art

Differential signaling is a commonly-used technique for transmitting information, whereby two complementary but opposite signals are sent on two separate, and typically balanced, transmission lines—possibly in a single cable. The motivation for employing differential signaling is invariably due to the need to suppress the effect of noise on the cabling used to transmit the information. For instance, even though the level of a signal transmitted over a cable may be reasonably large, say of the order of 100 millivolts, the length of the cable itself may cause the introduction of a significant degree of noise into both lines—in some cases up to ten volts of noise. By transmitting information in differential mode, where the signals are of opposite polarity to one another, the noise will however manifest as a common-mode signal.

The standard approach to recovering the original signal is to subtract the two signals on each line from one another in a pre-amplification stage, thereby rejecting the common-mode noise present on the two lines. Such an approach is commonly taken in high-quality microphone pre-amplifiers, particularly in mixing consoles of the known type, which pre-amplifiers also provide controllable gain.

Problems exist, however, with this approach to recovering the differential signal whilst maintaining common-mode rejection. Due to the inherent topology of circuits presently used in microphone amplifiers, there is no concept of electrical ground at the point in the circuit where gain is controlled. The introduction of variable gain elements that require a connection to ground, such as a digital-to-analog converter (DAC), is therefore not possible. Thus, up until now it has not been feasible to employ commodity DACs in differential signal amplifiers to allow digitally controllable gain.

BRIEF SUMMARY OF THE INVENTION

According to an aspect of the present invention, there is provided an amplifier for amplifying a differential audio signal having two complimentary parts, said amplifier having common-mode rejection and digital gain control, and comprising: a first current source configured to supply a constant level of current to a first current path, and a second current source configured to supply a constant level of current to a second current path; an input stage configured to modulate the current in said first current path and said second current path in response to a differential input signal, thereby producing an amplified differential signal defined by the difference in currents in said first current path and said second current path; an output stage configured to produce an output signal by amplifying said amplified differential signal; a feedback stage configured to modulate the current in said first current path by said output signal and to modulate the current in said second current path by the inverse of said output signal, so as to provide a degree of feedback to said input stage; wherein the degree of modulation by said feedback stage is determined by the attenuation provided by at least one multiplying digital-to-analog converter located therein.

According to further aspect of the present invention, there is provided a method of controlling the gain applied during amplification to a differential audio signal having two complementary parts, said method comprising steps of: (i) supplying a constant level of current to a first current path and a second current path; (ii) controlling the current in said first current path in response to the first part of said differential audio signal, and controlling the current in said second current path in response to the second part of said differential audio signal; (iii) amplifying the difference between the currents in said first current path and said second current path to produce an output signal; (iv) generating a first feedback control signal by attenuating said output signal, and generating a second feedback control signal by inverting and attenuating said output signal; (v) generating a degree of feedback by controlling the current in said first current path in response to said first feedback control signal and controlling the current in said second current path in response to said second feedback control signal; wherein the degree of attenuation applied during step (iv) is determined by the attenuation provided by at least one multiplying digital-to-analog converter.

DETAILED DESCRIPTION OF EXAMPLE EMBODIMENTS

The following embodiments are described in the context of providing a pre-amplification stage for a differential audio signal received from a microphone or a similar audio transducer, which is typically analog. However, it will be appreciated by those skilled in the art that the principles employed by the present invention have applicability in other fields, such as providing amplification for digital signals.

Figure 1:
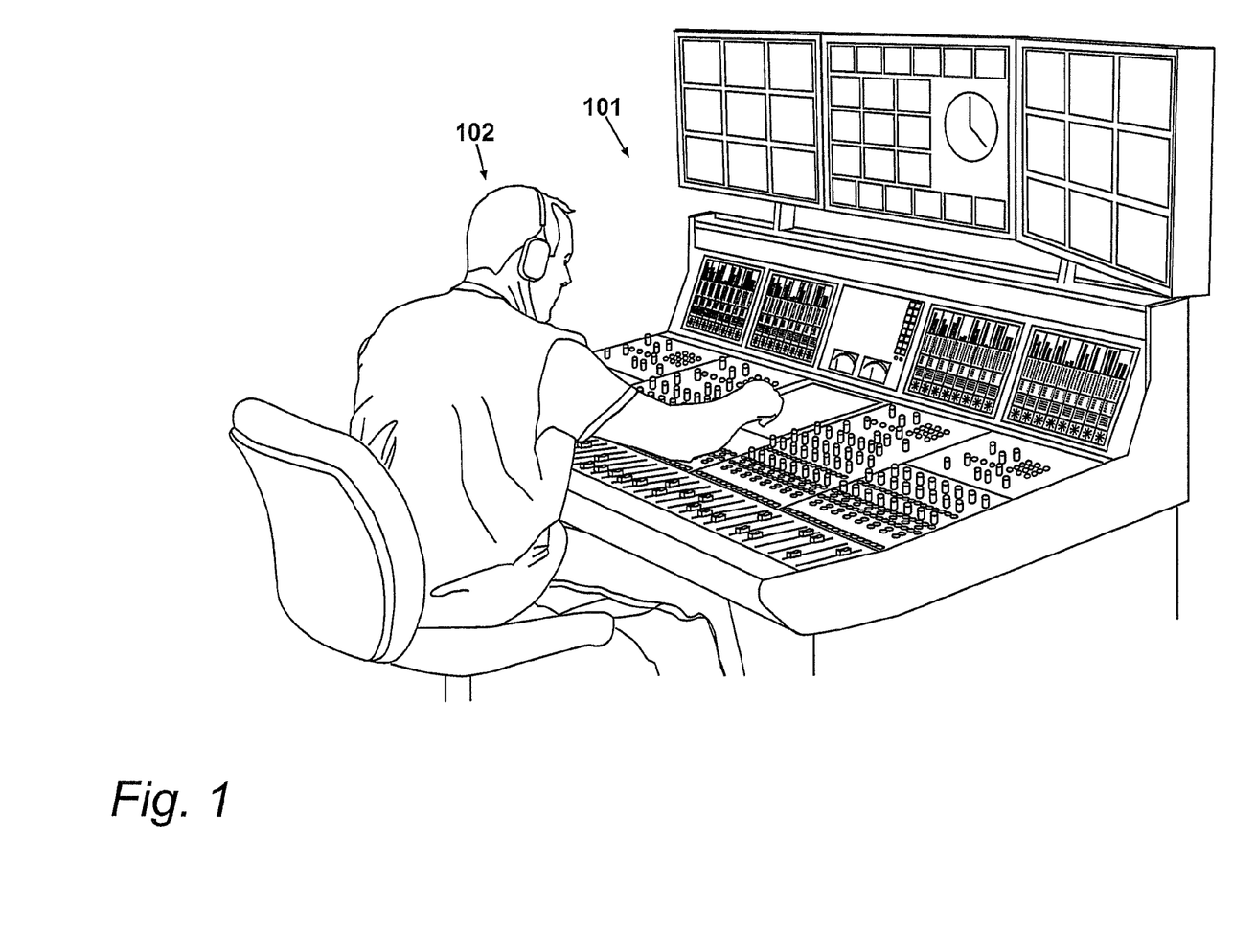
FIG. 1 shows an example of an environment in which the present invention can be used.

FIG. 1

An example of an environment in which the present invention can be used is shown in FIG. 1. A mixing console 101 is, in this environment, being employed to mix numerous channels of audio from many disparate signal sources into one output in a live broadcast system. An operator 102 is responsible for controlling the relative contribution of each audio source into the final mix prior to it being combined with a video signal for eventual broadcast. Of course, it will be appreciated by those skilled in the art that the use of mixing consoles like mixing console 101 is not exclusive to broadcast environments, with them also being employed in recording studios, public address systems and film post-production environments.

Figure 2:
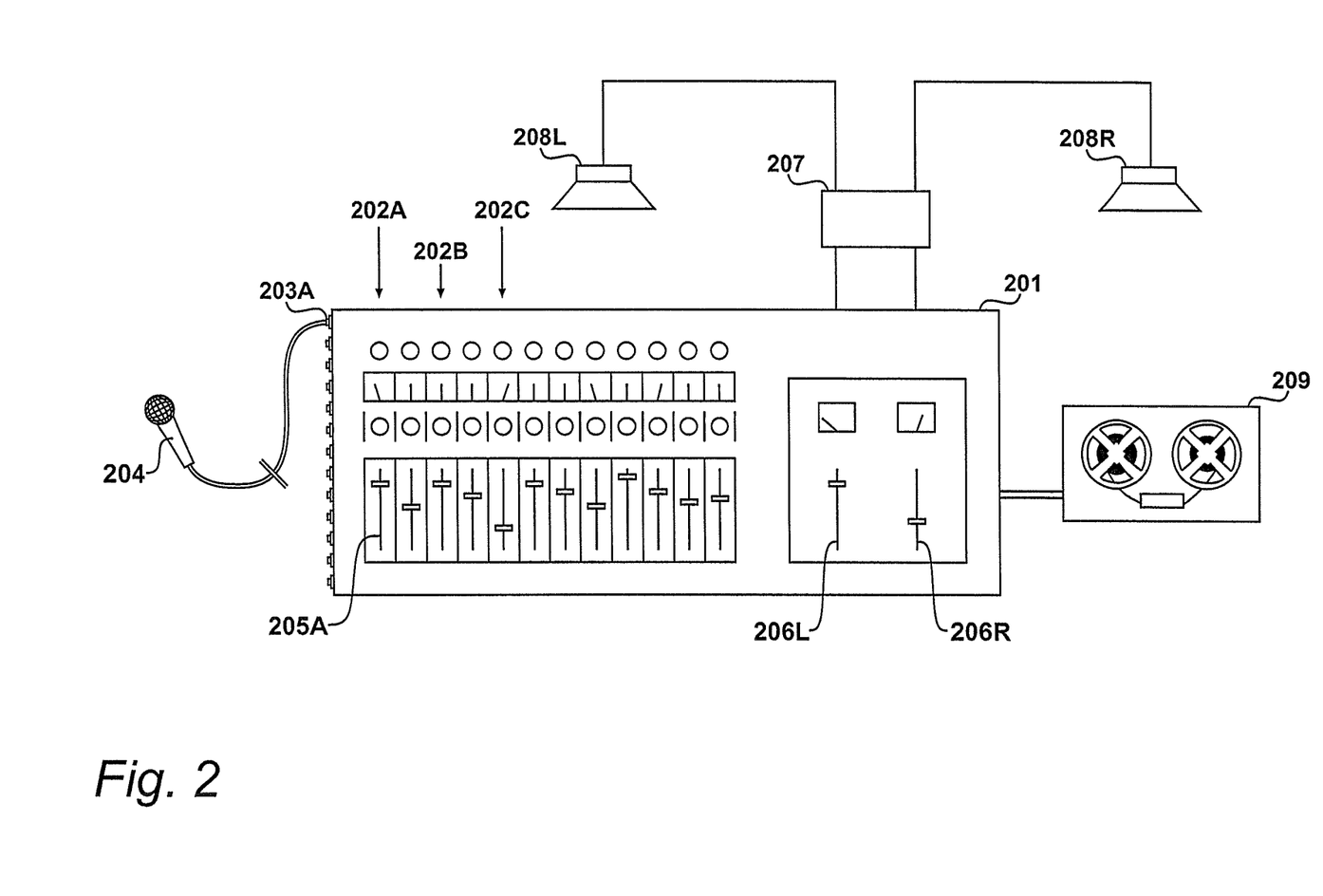
FIG. 2 shows a schematic representation of an exemplary mixing environment.

FIG. 2

A schematic representation of an exemplary mixing environment is illustrated in FIG. 2. The previously-identified mixing console is shown in simplified form at 201, and comprises a number of channel strips such as channel strips 202A, 202B and 202C. Each of these channel strips, for instance channel strip 202A, corresponds to one particular input, such as input 203A which receives a differential-mode signal from a microphone 204. Each channel strip includes controls to effect various modification of the input signal, such as the gain applied by a pre-amplifier and the degree of frequency-based equalization to be applied. Faders, such as fader 205A, are also present to control the relative contribution of the channel to the final mix. In this example, master faders 206L and 206R are also present which control the contribution of each of two stereo channels to the final mix. A power amplifier 207 is also provided, to allow the mix to be monitored by an operator by means of two loudspeakers, 208L and 208R. In addition, in this example, a recording of the final mix is made by a recording device 209.

Whilst not shown in the schematic, as mentioned previously a degree of pre-amplification is applied to input signals received at each input of the mixing console 201. The degree of gain applied during this process is very much dependent upon the input source, but gain is particularly important when, as illustrated in the Figure, an input signal is received from a microphone. The output of high-quality microphones, in particular due to their high impedances (known in the art as hi-Z) can in many cases only be of the order of between one and ten millivolts. In order to increase the level of this signal to line-level in order for signal processing to take place, a high degree of gain must be applied, sometimes up to 100 decibels.

In addition, in traditional configurations of mixing consoles, gain of the pre-amplification stage must still be based on "analog" controls, typically operating mechanically variable resistors or the like. This has been seen by many skilled in the art as one of a small number of remaining stumbling blocks in the move to fully digitally controlled mixing consoles.

Figure 3:
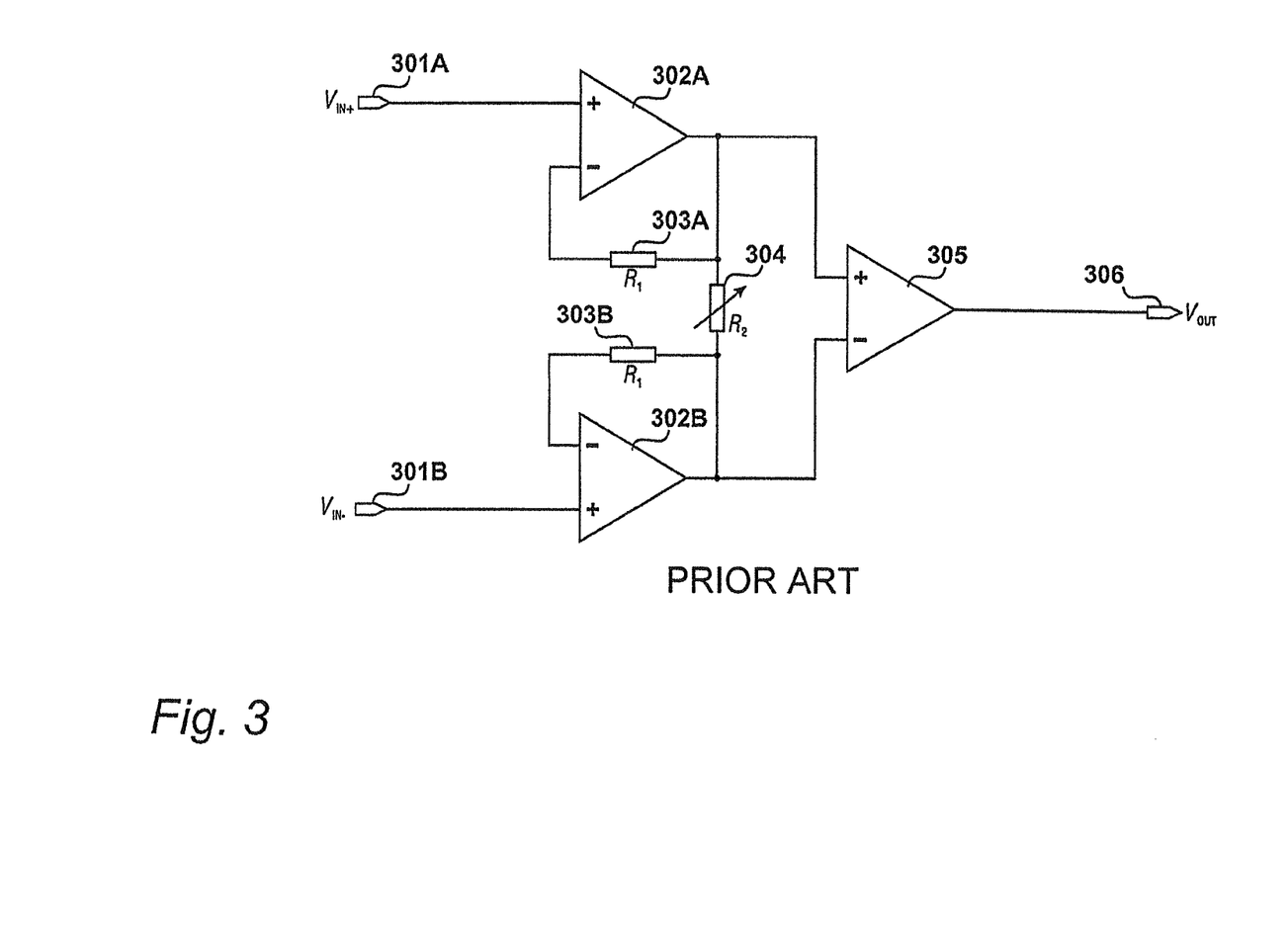
FIG. 3 shows an example of a known approach to providing a pre-amplification stage for a microphone.

FIG. 3

As will be appreciated by those skilled in the art, the output of most high-quality microphones and similar audio transducers is inherently differential. Thus, standard approaches to providing a pre-amplifier stage for signals from such microphones typically involve utilizing a circuit topology akin to an instrumentation amplifier, such as that illustrated in FIG. 3.

One input line 301A, carrying one part of the differential input signal having a positive sense ($V_{IN+}$) is complemented by another input line 301B carrying the other part of the differential input signal having a negative sense ($V_{IN-}$). A first differential amplifier 302A is present, receiving at its non-inverting input the signal carried by input line 301A, and applies a degree of gain. A second differential amplifier 302B is also present, similarly receiving at its non-inverting input the signal carried by input line 301B, and also applies a degree of gain. The outputs of the two differential amplifiers are fed back via respective negative feedback paths to their inverting inputs via two respective resistors 303A and 303B, each having a resistance $R_1$. The feedback paths are also bridged by a variable gain element 304 having a resistance $R_2$. The output of differential amplifier 302A is provided to the non-inverting input of a precision subtractor 305, whilst the output of differential amplifier 302B is provided to the inverting input of the precision subtractor 305. The output of the precision subtractor at 306 ($V_{OUT}$) is then an amplified version of the differential input signal, with no common-mode component present.

Whilst the implementation of the amplifier topology illustrated in FIG. 3 has, for an appreciable length of time, been very successful, there has been a drive towards both reducing power requirements and providing digital control of circuitry within mixing consoles. As can be seen in the Figure, it is only at precision subtractor 305 that the common-mode signal present on the inputs is rejected. Thus, differential amplifiers 302A and 302B must amplify this common-mode signal. Thus, if such an amplifier is to provide sufficient gain to be useful, it is likely that the peak voltage required due to the presence of the common-mode signal will be relatively large compared to that provided by conventional supply rails. They therefore must have available to them an abnormally high voltage range, which consumes a large quantity of power and thus can in some circumstances generate an unmanageable amount of heat. In addition, problems with this topology exist in that the successful operation of precision subtractor 305 depends on exactly matched resistors. Even a 0.1 percent matching error between resistor values will severely limit its ability to reject common-mode signals. This has the effect of driving up component Costs.

In addition, in the topology identified in the Figure, the variable gain element 304 is at a point in the circuit where there is no concept of a stable ground. The common-mode signal present on the inputs can, as previously mentioned, vary over a high range, and so any attempt to introduce a variable gain element that is by design required to be ground-referenced (such as a DAC) will inevitably encounter problems.

Figure 4:
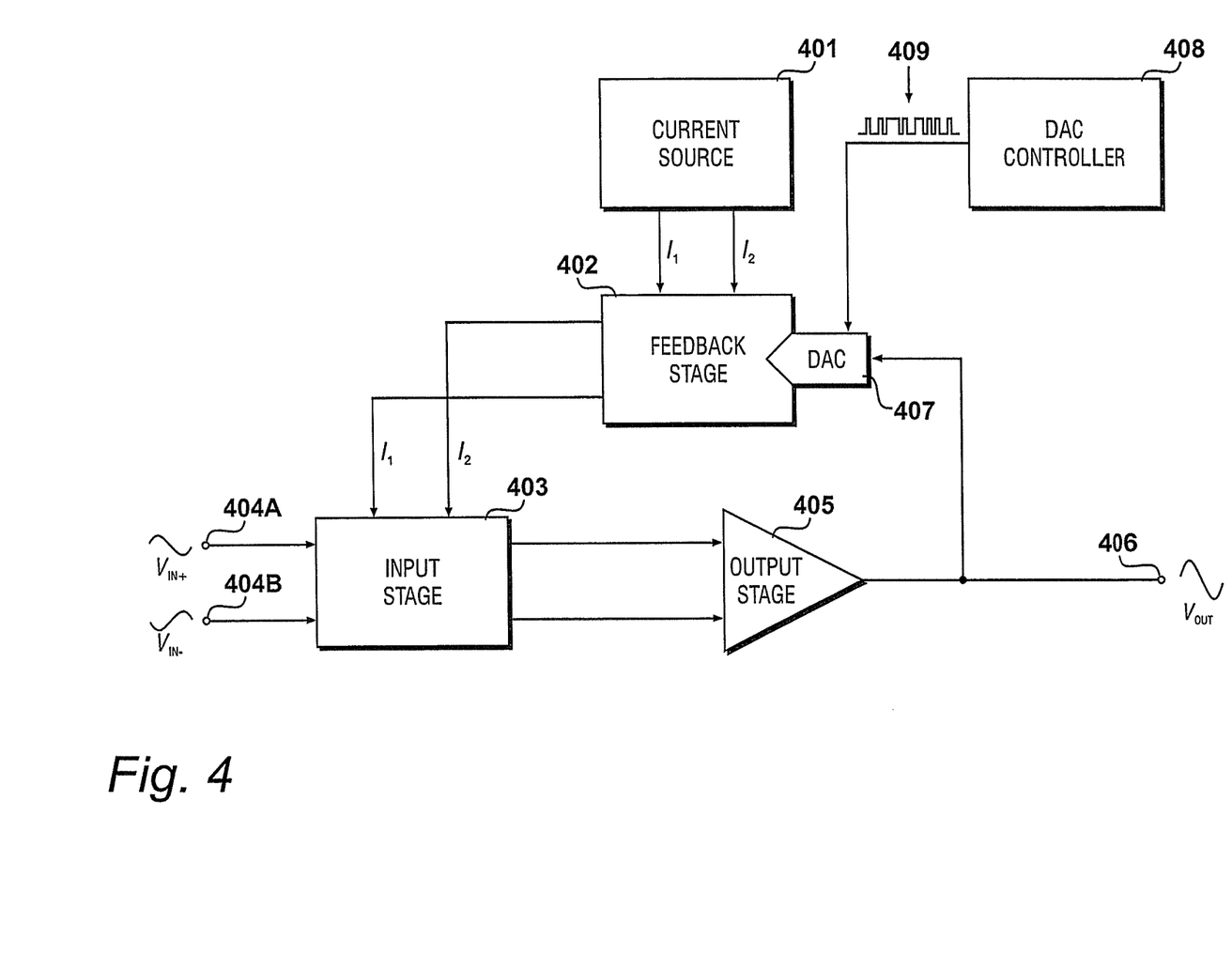
FIG. 4 shows a high-level block diagram of a circuit topology implementing the principles of the present invention.

FIG. 4

The present invention therefore takes a technical approach to solving this problem. A high-level block diagram of an inherently ground-referenced circuit topology implementing this technical approach is shown in FIG. 4.

A current source 401 is provided which supplies a constant level of current through a first current path, identified as $I_1$, and a second current path, identified as $I_2$. The current paths extend through a feedback stage 402 to an input stage 403. Input stage 403 is configured to modulate the currents in the first and second current paths in response to changes in voltages on two inputs 404A and 404B, each responsible for receiving one part of a differential input signal having complementary voltages $V_{IN+}$ and $V_{IN-}$. Following modulation by the input stage, which provides a first amplification of an input signal, an output stage 405 is present which amplifies the difference in currents flowing through the two current paths $I_1$ and $I_2$. The output of this differential amplification is provided as a signal $V_{OUT}$ at an output terminal 406.

The output signal $V_{OUT}$ is, as can be seen in the Figure, also supplied to feedback stage 402. A DAC 407 complements the feedback stage, and applies a degree of attenuation to the output signal. The degree of attenuation applied by DAC 407 is controlled by a DAC controller 408, which supplies a digital word 409 to the DAC to effect control of its attenuation. The DAC interprets the digital word (possibly a set of bits) and establishes itself as an attenuating element in the circuit in accordance with the selected attenuation level. In the context of the mixing console identified in FIG. 2, therefore, a digital control can be provided that is not physically coupled to the DAC in the same way as, say, a dial is physically coupled to a variable resistor, for instance. The control for DAC 407 can therefore be in fact controlled from a remote digital audio workstation (DAW), if required.

Feedback stage 402 is configured to modulate the currents in the two current paths $I_1$ and $I_2$ in a similar, but opposite way to the modulation by input stage 403. The amount of modulation of current in the two current paths $I_1$ and $I_2$ by feedback stage 402 is dependent upon the degree of attenuation of the output signal $V_{OUT}$ by DAC 407.

By modulating the current in the current paths, feedback stage 402 thus plays the role of encouraging a return to more balanced current conditions in the two current paths and maintaining the symmetry of the amplifier, thereby affecting the overall gain of the structure.

Figure 5:
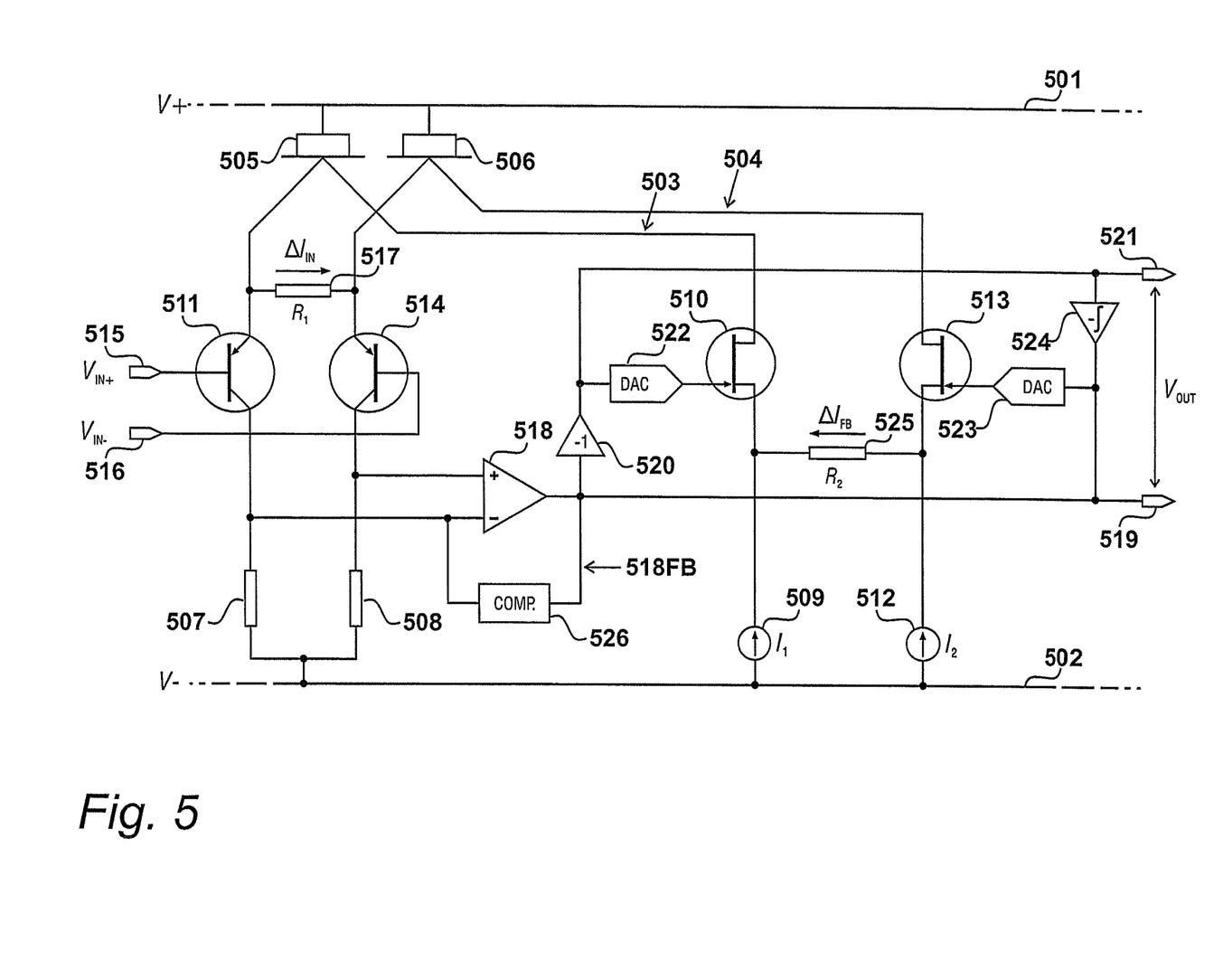
FIG. 5 shows a practical approach to achieving the required functionality of the present invention.

According to one embodiment of the present invention, the two current paths include a respective current mirror between the feedback stage and the input stage, moving the two stages away from being in series. This has the benefit of allowing each stage access the full voltage range between supply rails. FIG. 5

A practical approach to achieving the required functionality of the present invention is illustrated in FIG. 5.

A positive supply rail 501 and a negative supply rail 502 are provided, which, in an embodiment have a voltage of +15 volts and −15 volts respectively. A first current path 503 and a second current path 504 extend upward from the negative supply rail to a first current mirror 505 and a second current mirror 506. The current mirrors are configured to copy the current from one side of the circuit to the other, and maintain current through the current paths regardless of loading in active devices on each side. First current path 503 and second current path 504 then extend downward towards the negative supply rail 502 via two resistors 507 and 508, each having a resistance of around 500 ohms.

From the negative supply rail, first current path 503 includes a first constant current source 509 connected to the source of a first field effect transistor (FET) 510, which in this particular implementation is an n-channel junction field effect transistor (JFET). The path continues with the drain of first FET 510 being connected, via first current mirror 505, to the emitter of a first bipolar junction transistor (BJT) 511. The collector of first BJT 511 is then connected to resistor 507. In this embodiment the transistors will be recognized as being PNP construction, although it will be appreciated by those skilled in the art that NPN-type components could be used with appropriate modifications being made.

The second current path is substantially similar to the first, having a second constant current source 512 connected to the source of a second FET 513. The drain of second FET 513 is connected, via current mirror 506, to the emitter of a second BJT 514, whose collector is in turn connected to resistor 508.

Input signals themselves, identified as $V_{IN+}$ and $V_{IN-}$, are received at input terminals 515 and 516. Input terminal 515 is coupled to the base of BJT 511, whilst input terminal 516 is coupled to the base of BJT 514. Thus, input voltages received via the input terminals control the flow of current through BJTs 511 and 514. The presence of a differential signal on the two inputs results in the current flowing through BJT 511 tending to decrease, and the current flowing through BJT 514 tending to increase. Of course, should an alternative embodiment be constructed utilizing NPN bipolar junction transistors, then the opposite will occur, and so those skilled in the art will appreciate that in such circumstances appropriate measures should be taken to change the polarity of the input terminals.

It will be seen by those skilled in the art that the two BJTs receiving the two complementary parts of the differential signal together form a first differential amplifier, with the input terminals providing inputs for receiving differential input signals. An input-stage shunting resistance 517, having a resistance $R_1$, is also placed between the emitters of BJTs 511 and 514. The combination of input terminals 515 and 516, BJTs 511 and 514, and input-stage shunting resistance 517 serves to provide the functionality of input stage 403 for the amplifier structure, as previously referenced with reference to FIG. 4.

The voltage formed at the collector of first BJT 511 (due to the presence of resistor 507) is coupled into the inverting input of a second differential amplifier, provided in this embodiment by an operational amplifier 518. This provides substantially the functionality of output stage 405 previously referenced with reference to FIG. 4, and, in an embodiment, is configured to provide 100 decibels of gain. It will of course be appreciated that operational amplifier 518 can be configured to operate with alternative (and perhaps variable) levels of gain in dependence upon the particular application of the amplifier structure.

In addition, the voltage formed at the collector of second BJT 514 (due to the presence of resistor 508) is coupled to the non-inverting input of operational amplifier 518, having a negative feedback path 518FB. Thus, operational amplifier 518 amplifies the difference between the voltages developed in first current path 503 and second current path 504 following modulation of the currents therein by BJTs 511 and 514.

The output of operational amplifier 518 is primarily coupled to a first output terminal 519. The output of operational amplifier 518 is also coupled to a unity gain inverting operational amplifier 520, which serves to invert the signal. The output of operational amplifier 520, in effect an inverted version of the output from operational amplifier 518, is therefore supplied to a second output terminal 521. Thus, a ground-referenced output voltage $V_{OUT}$ is developed between the output terminals.

In addition to being coupled to output terminal 521, the output of operational amplifier 520 is also provided, via a DAC 522, to the gate of FET 510. A complementary DAC 523 is also provided on the other side of the structure, and is connected to the gate of FET 513. In this embodiment, the DACs employed are matched 14-bit parts, and thus provide $2^{14}=16384$ attenuation steps. However, it will be appreciated that higher or lower precision parts may be substituted in view of cost constraints, for example.

The input to DAC 523 is coupled firstly to the output of operational amplifier 518. In addition, an inverting DC servo 524 (also known in the art as an integrator, which serves to ensure that the output of DAC 523 tends to zero when no output signal is received from operational amplifier 520) couples the output of operational amplifier 520 to the input of DAC 523. The two DACs serve to provide attenuation of their input signals, at a degree determined by the provision of a digital word via a control interface. Referring to FIG. 4, the digital word is provided by DAC controller block 408.

Referring again to FIG. 5, it will be apparent to those skilled in the art that the configuration of the DACs in a structure such as that illustrated is very much dependent upon the type of transistors employed. In this embodiment, due to FETs being used (which control current flowing between their source and drain terminals in response to a voltage being applied to the gate), the DACs, which alter their output currents in response to an input voltage and a preset attenuation level, are provided by attenuating multiplying digital-to-analog converters (MDACs) in combination with an operational transimpedance amplifier, thus providing a voltage to the gate of the coupled FET. The precise configuration will be described further with reference to FIG. 7. However, it is also envisaged that in alternative embodiments, FET 510 and FET 513 could be replaced by appropriately selected BJTs. As a BJT alters the current flow between its emitter and collector in response to current flowing from or to its base, then the output of an MDAC can be used unaltered. It will be seen by those skilled in the art that, in a similar way to BJTs 511 and 514, FETs 510 and 513 provide an additional, third differential amplifier in the structure.

In an embodiment, the distortion caused by the presence of the FETs can be controlled by including an operational amplifier (not shown) between the output of DAC 522 and the gate of FET 510, and another operational amplifier (not shown) between the output of DAC 523 and the gate of FET 513. The voltages at the sources of the FETs are fed back to the corresponding DACs. In this application, with the output of the DACs being supplied to the inverting inputs of the operational amplifiers, and the non-inverting inputs being connected to ground, the operational amplifiers act as linearizing elements and thus serve to eliminate any distortion caused by the FETs.

Referring again to FIG. 5, a feedback-stage shunting resistance 525, having a resistance $R_2$, is placed between the drains of FET 510 and FET 513. Thus, it can be seen that the two FETs, in combination with their respective DACs and feedback-stage shunting resistance 525, serve to provide the functionality of feedback stage 402 as previously described with reference to FIG. 4. Responsive to a differential signal synthesized from the output of the output stage, the feedback stage modulates currents in first current path 503 and second current path 504, so as to introduce a degree of feedback to the input stage. The degree of feedback introduced is determined by the attenuation of the two DACs present in the feedback stage.

In the embodiment illustrated in FIG. 5, the negative feedback path 518FB around operational amplifier 518 is configured to operate as a dominant pole compensator, and thus includes a compensation circuit 526. The role of compensation circuit 526 is to encourage stability of the output stage. In this embodiment, this is achieved by configuring the compensation circuit 526 such that the gain of operational amplifier 518 reduces to 0 decibels before the phase delay it introduces reaches −180 degrees. Compensation circuit 526 therefore includes, in one embodiment, a capacitor that provides a dominant pole in the system, and introduces a reasonable phase margin of, say, 60 degrees. In another embodiment, expanded upon with reference to FIG. 8, a plurality of capacitors are provided, each having a different capacitance to introduce dominant poles at different frequencies, tuned to particular gain ranges of the entire amplifier structure. This guarantees stability of the structure at all possible gain levels.

A brief overview of the operation of the circuit topology illustrated in FIG. 5 will now be provided. Say a differential input voltage of $V_{IN}$ volts is provided across the input terminals 515 and 516. This differential voltage is supplied to the bases of BJTs 511 and 514 in the input stage differential amplifier. Modifications then occur to the emitter currents of the BJTs—say, for instance, that current from the emitter of BJT 511 increases and current from the emitter of BJT 514 decreases. This characteristic of the transistors means that an attempt is made to impress the input voltage across input-stage shunting resistance 517, resulting in a steering current $\Delta I_{IN}$ (equal to $V_{IN}$ divided by $R_1$) shunting through the resistance. It will be immediately apparent that any common-mode voltage presented to the input terminals 515 and 516 will be completely rejected, as there is simply no forward common-mode path for such voltages to take. If common-mode voltages are present, they will adjust the base voltages of BJTs 511 and 514, but at an equivalent level and in the same sense in terms of polarity. Thus, no current will shunt across the resistance, and no output signal will, in turn, be generated by operational amplifier 518.

In any event, unchecked, current will flow from first current path 503 to second current path 504, which will lead to changes to the collector currents of BJTs 511 and 514, and a subsequent large differential voltage being developed across the inputs to operational amplifier 518. This will in turn lead to a vast and uncontrolled level of amplification due to the high gain of operational amplifier 518, which would eventually become saturated due to the maximum amount of voltage supplied by voltage rails 501 and 502. Thus, feedback must be provided to return the emitter currents of BJTs 511 and 514 towards a balanced condition, with just enough voltage drop across the input-stage shunting resistance to cause the output of operational amplifier 518 to be such that the feedback can continue to be produced.

This output voltage from operational amplifier 518 is also, in effect, negatively coupled to FET 510 via DAC 522, and positively coupled to FET 513 via DAC 523 in the feedback stage. Being equal but opposite voltages, the voltages applied to the gates of the FETs result in equal and opposite modifications to the drain currents of the FETs. This results in the emergence of a similar condition to that in the input stage, in that a voltage of level $V_{FB}$ (equal to $V_{OUT}$) is impressed across feedback-stage shunting resistance 525 (having resistance $R_2$), resulting in a current of magnitude $\Delta I_{FB}$ (equal to $V_{OUT}$ divided by $R_2$) flowing therethrough. However, due to the polarity of the voltages applied to the gates of the FETs, the steering current $\Delta I_{FB}$ shunts in the opposite direction to the steering current through input-stage shunting resistance 517. This has the effect of rebalancing the circuit, as current mirrors 505 and 506 copy the current flowing from the drains to the sources of FETs 510 and 513 to the emitters of the BJTs 511 and 514 through the respective current paths.

In order for this current balancing to control the collector currents of BJTs 511 and 513 at a satisfactory level, the feedback stage steering current $\Delta I_{FB}$ is effectively equal to the input steering current $\Delta I_{IN}$, save for a slight difference that is enough to cause a voltage drop across the input-stage shunting resistance 517 that will, in turn, be amplified by operational amplifier 518 to provide an output signal $V_{OUT}$ at a sufficient level to cause the generation of the feedback stage steering current $\Delta I_{FB}$.

In order for this current balancing to control the collector currents of BJTs 511 and 514 at a satisfactory level, the feedback stage steering current $\Delta I_{FB}$ is effectively equal to the input steering current $\Delta I_{IN}$, save for a slight difference that is enough to cause a voltage drop across the input-stage shunting resistance 517 that will, in turn, be amplified by operational amplifier 518 to provide an output signal $V_{OUT}$ at a sufficient level to cause the generation of the feedback stage steering current $\Delta I_{FB}$.

Thus, the gain A of the amplifier structure as a whole ($V_{OUT}$ divided by $V_{IN}$) can be shown to be equal to the ratio of resistances provided by feedback-stage shunting resistance 525 and input-stage shunting resistance 517, or $R_2$ divided by $R_1$, assuming no attenuation by DACs 522 and 523 in the feedback stage. However, should the DACs' attenuation be increased, then the voltages supplied to the gates of FETs 510 and 513 will decrease in magnitude. This will in turn result in a reduction in the voltage across feedback-stage shunting resistance 525, and as the degree of resistance $R_2$ of feedback-stage shunting resistance 525 remains fixed, a corresponding reduction in the amount of current shunting therethrough. Thus, the level of current that shunts across input-stage shunting resistance 517 will tend to increase, which in turn will result in the manifestation of a larger difference in voltage at the inputs of operational amplifier 518, giving a more highly amplified output signal $V_{OUT}$.

In effect, therefore, the gain of the entire structure increases at a degree determined by the attenuation provided by the two DACs, 522 and 523. The overall gain of the amplifier, A, can therefore be expressed as being proportional to the value of the resistance provided by feedback-stage shunting resistance 525 multiplied by an attenuation variable k provided by the DACs 522 and 523, divided by the resistance provided by input-stage shunting resistance 517:

$$A \propto \frac{kR_2}{R_1} \quad \text{[Equation 1]}$$

where k ranges between 1 and $2^n$, with 1 being the lowest available attenuation provided by the DACs in concert, and $2^n$ being the number of attenuation steps available.

Thus, the particular embodiment of the present invention illustrated in FIG. 5 allows the control of the gain by changing the attenuation provided by two circuit elements: DACs 522 and 523, providing substantially the functionality of block 407 identified in FIG. 4. It is of course important to note that the circuit topology illustrated in FIG. 5 is fully ground-referenced, and so there are no floating common-mode voltages present. It is this property that allows the use of DACs to provide variable attenuation elements, as they must, due to their internal resistor-ladder network, be connected to ground.

It has been found through research conducted by the present applicant that a more sophisticated approach to controlling the attenuation provided by DACs 522 and 523 can improve the precision of the amplifier. Whilst conventional wisdom may suggest that alterations to the attenuation of the DACs should occur in unison, i.e. the attenuation constant k identified above only having 16384 possible values when 14-bit DACs are employed, it has been found that alternated stepping of attenuation levels in DACs 522 and 523 by DAC controller 408 is possible. Thus, the attenuation constant k in fact can take 32768 (or $2^{15}$) values when 14-bit DACs are used. More generally, therefore, the use of n-bit DACs in the embodiment illustrated in FIG. 5 provides (n+1)-bit resolution in terms of the number of steps possible in the overall gain of the amplifier. Thus, in the equation identified above, the gain of the structure, having two 14-bit DACs and equally-valued shunting resistances 517 and 525, could range from a value of A proportional to 1 to a value of A proportional to $2^{15}=32768$.

The circuit shown in FIG. 5 can generally be described as "balanced", and as a result exhibits a degree of distortion in the order of 0.005 percent. This is predominantly due to the symmetry provided by the inclusion of DACs 522 and 523 at the gates of the FETs 510 and 513.

Figure 6:
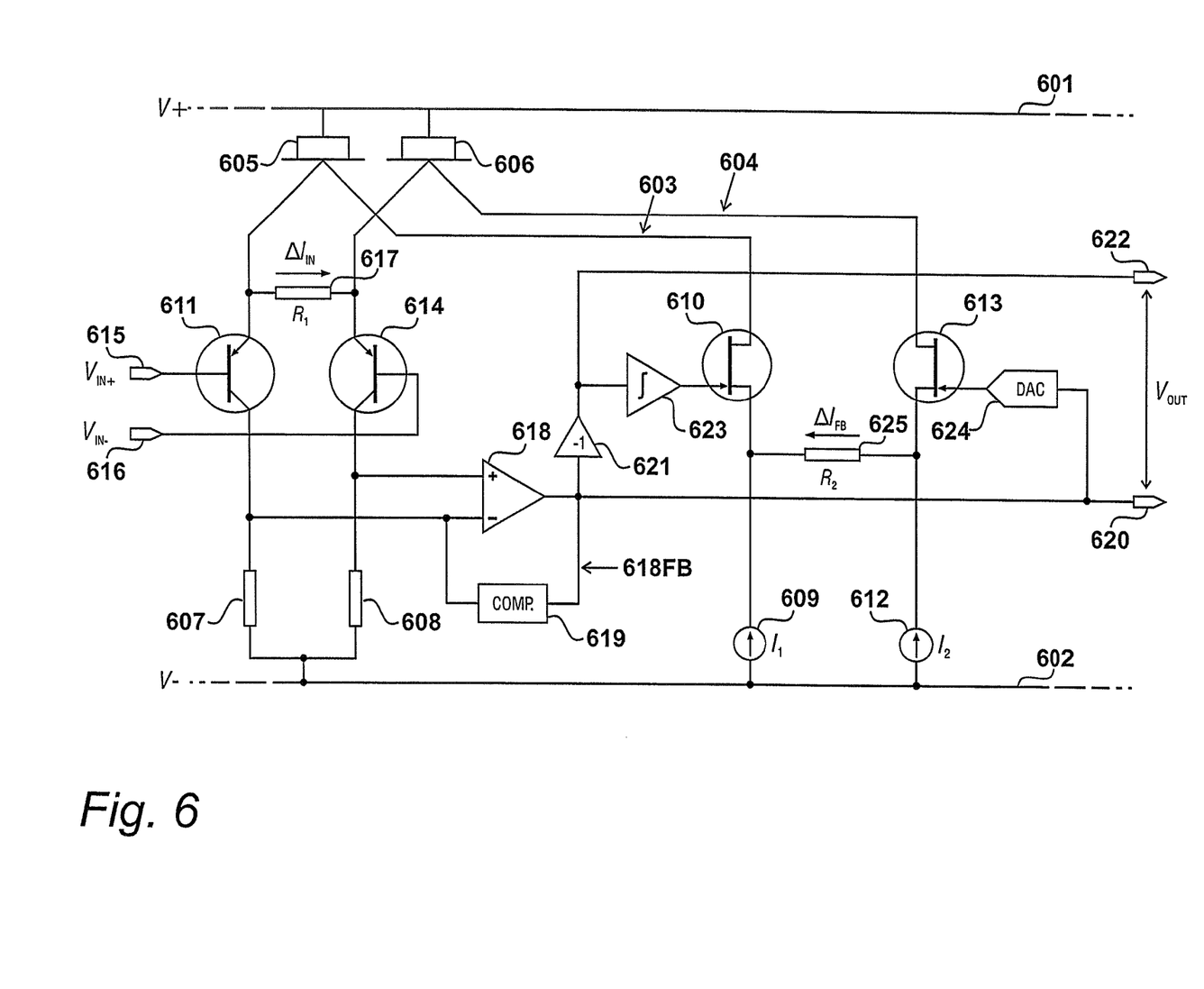
FIG. 6 shows an alternative embodiment based on the circuit illustrated in FIG. 5.

FIG. 6

An alternative embodiment of the present invention is illustrated in FIG. 6, and based on the principles of the topology presented in FIG. 5.

As can be seen in the illustration, there is still provided circuit elements that fulfill the requirement of the present invention for a current source, an input stage, a feedback stage (including at least one DAC) and an output stage.

Thus, a positive supply rail 601 and a negative supply rail 602 are provided. A first current path 603 and a second current path 604 extend upward from the negative supply rail to a first current mirror 605 and a second current mirror 606. First current path 603 and second current path 604 then extend downward towards the negative supply rail 602 via two resistors 607 and 608, each having a resistance of around 500 ohms.

From the negative supply rail, first current path 603 includes a first constant current source 609 connected to the source of a first FET 610, which in this particular implementation is an n-channel JFET. The path continues with the drain of first FET 610 being connected, via first current mirror 605, to the emitter of a first BJT 611. The collector of first BJT 611 is then connected to resistor 607. In this embodiment the transistors will be recognized as being PNP construction, although it will again be appreciated by those skilled in the art that NPN-type components could be used with appropriate modifications being made.

The second current path is substantially similar to the first, having a second constant current source 612 connected to the source of a second FET 613. The drain of second FET 613 is connected, via current mirror 606, to the emitter of a second BJT 614, whose collector is in turn connected to resistor 608.

Input signals themselves, identified as $V_{IN+}$ and $V_{IN-}$, are received at input terminals 615 and 616. Input terminal 615 is coupled to the base of BJT 611, whilst input terminal 616 is coupled to the base of BJT 614. Thus, input voltages received via the input terminals control the flow of current through BJTs 611 and 614.

It will again be seen by those skilled in the art that the two BJTs receiving the two complementary parts of the differential signal together form a first differential amplifier, with the input terminals providing inputs for receiving differential input signals. An input-stage shunting resistance 617, having a resistance $R_1$, is also placed between the emitters of BJTs 611 and 614. The combination of input terminals 615 and 616, BJTs 611 and 614 and input-stage shunting resistance 617 serves to provide the functionality of input stage 403 for the amplifier structure identified in FIG. 6, as previously referenced with reference to FIG. 4.

The voltage formed at the collector of first BJT 611 (due to the presence of resistor 607) is coupled into the inverting input of a second differential amplifier, provided in this embodiment by an operational amplifier 618. This provides substantially the functionality of output stage 405 previously referenced with reference to FIG. 4. In addition, the voltage formed at the collector of second BJT 614 (due to the presence of resistor 608) is coupled to the non-inverting input of operational amplifier 618, having a negative feedback path 618FB, including a compensation circuit 619 (equivalent to compensation circuit 526 previously described with reference to FIG. 5) to encourage stability. Thus, operational amplifier 618 amplifies the difference between the voltages developed in first input path 603 and second input 604 following modulation of the currents therein by BJTs 611 and 614.

The output of operational amplifier 618 is primarily coupled to a first output terminal 620. The output of operational amplifier 618 is also coupled to a unity gain inverting operational amplifier 621, which serves to invert the signal. The output of operational amplifier 621, in effect an inverted version of the output from operational amplifier 618, is therefore supplied to a second output terminal 622. Thus, a ground-referenced output voltage $V_{OUT}$ is developed between these output terminals.

The output of operational amplifier 621 is also coupled—via a DC servo 623 to remove any DC offset—to the gate of FET 610, thus modulating the current in first current path 603. The output of operational amplifier 618 is also coupled, via a DAC 624 (similar in possible arrangements to DACs 522 and 523 identified in FIG. 5), to the gate of FET 613, thereby modulating the current in second current path 604. As previously described with reference to FIG. 5, a linearizing operational amplifier (not shown) can be included between the output of DAC 624 and the gate of FET 613 to substantially eliminate the distortion caused by the FET's operation. Referring again to FIG. 6, a feedback-stage shunting resistance 625, having a resistance $R_2$, is also placed between the drains of FET 610 and FET 613.

Thus, in operation, gain of the overall structure is controlled by DAC 624, which effects changes in the modulation of current in second current path 604. Thus results in changes to the amount of current that shunts across input-stage shunting resistance 617, and hence modifications to the level of the output signal from operational amplifier 618. The number of overall amplifier gain steps in this embodiment is simply equal to the number of attenuation steps provided by DAC 624, so for a 14-bit part, 16384 gain steps are available.

The circuit shown in FIG. 6 can generally be described as "unbalanced" due to only one attenuating element being present in the feedback stage, and as a result exhibits a degree of distortion of the order of 0.5 percent. However, inclusion of only a single DAC reduces component costs by an appreciable amount.

Figure 7:
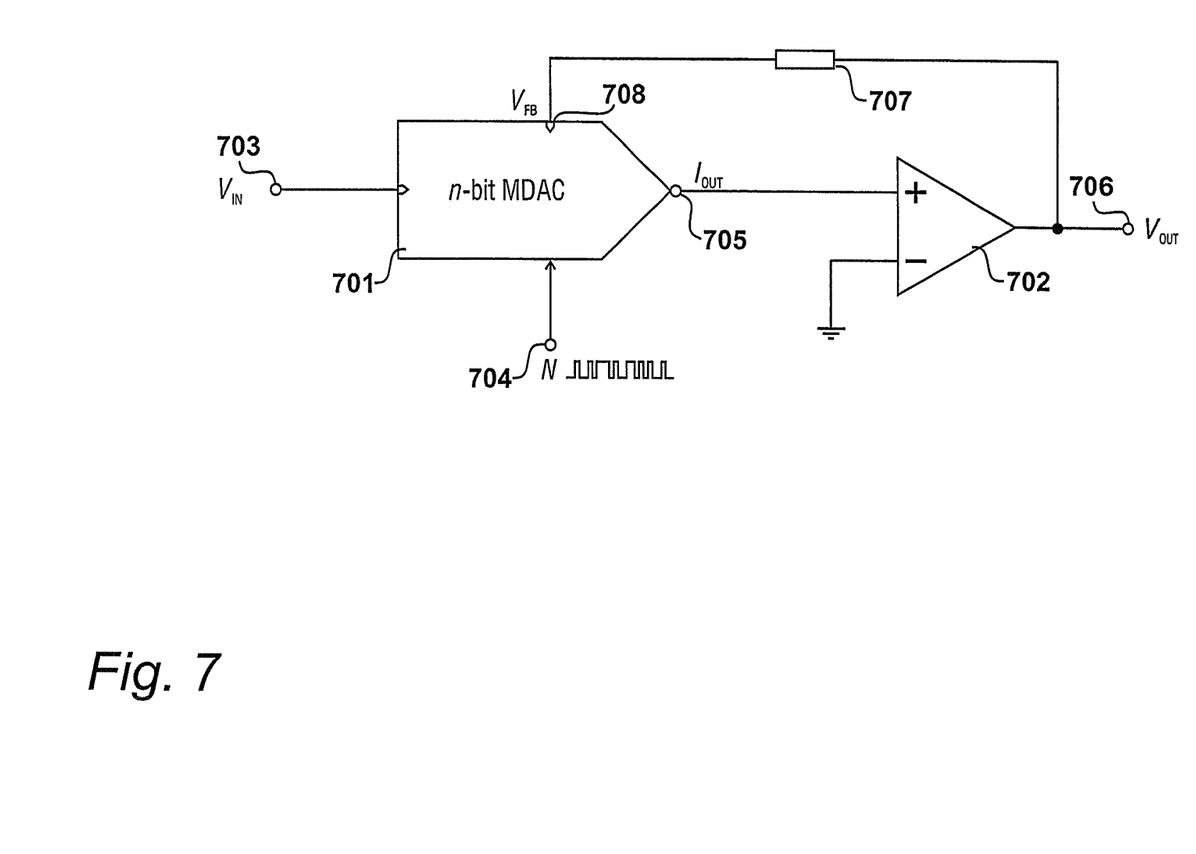
FIG. 7 shows an approach to implementing digital-to-analog conversion.

FIG. 7

As previously described with reference to FIGS. 5 and 6, the term "DAC" as used herein is used to generally refer to a circuit element configured to receive an indication via a control interface of a selected attenuation level. The indication generally takes the form of a digital word, i.e. a group of bits understood as an instruction by the DAC to adopt a corresponding attenuation level.

The DACs referred to in FIGS. 5 and 6 were, in those embodiments, illustrated as interfacing with field effect transistors. The most practical way to implement a digital-to-analog conversion is to employ MDACs, which, as mentioned previously, receive an input voltage and, based on their attenuation, output a current. Thus, extra capability must be provided to convert this current into a voltage such that it can control the gate of the FETs.

Such an approach is illustrated in FIG. 7, where an n-bit MDAC 701 is provided along with an operational amplifier 702 operating as a current-to-voltage converter: an operational transimpedance amplifier. MDAC 701 includes an input terminal 703 at which an input reference voltage is received. Referring to FIGS. 5 and 6, the reference voltage would be the output of inverting operational amplifiers 520 and 621 respectively. Referring again to FIG. 7, a control interface 704 is present as well, and receives from a digital controller (for example, a digital gain control in a mixing console) a digital word identifying a value N for the desired level of attenuation to be adopted by the MDAC. Output current is supplied from an output 705 in MDAC 701 to the non-inverting input of operational amplifier 702, whose inverting input is coupled to circuit ground. The output of operational amplifier 702 is provided to an output terminal 706, and is also coupled, via a feedback resistor 707, to a feedback input 708 in MDAC 701 to improve stability of the structure. The overall "gain" of the DAC system shown in FIG. 7 (provided by the combination of MDAC 701 and operational amplifier 702) can be shown to be equal to the value N supplied to control interface 704 divided by $2^n-1$. So, for instance, if a digital word is provided to MDAC 701 corresponding to a value of N of 8192, and MDAC 701 is a 14-bit part, the gain will be one half.

Figure 8:
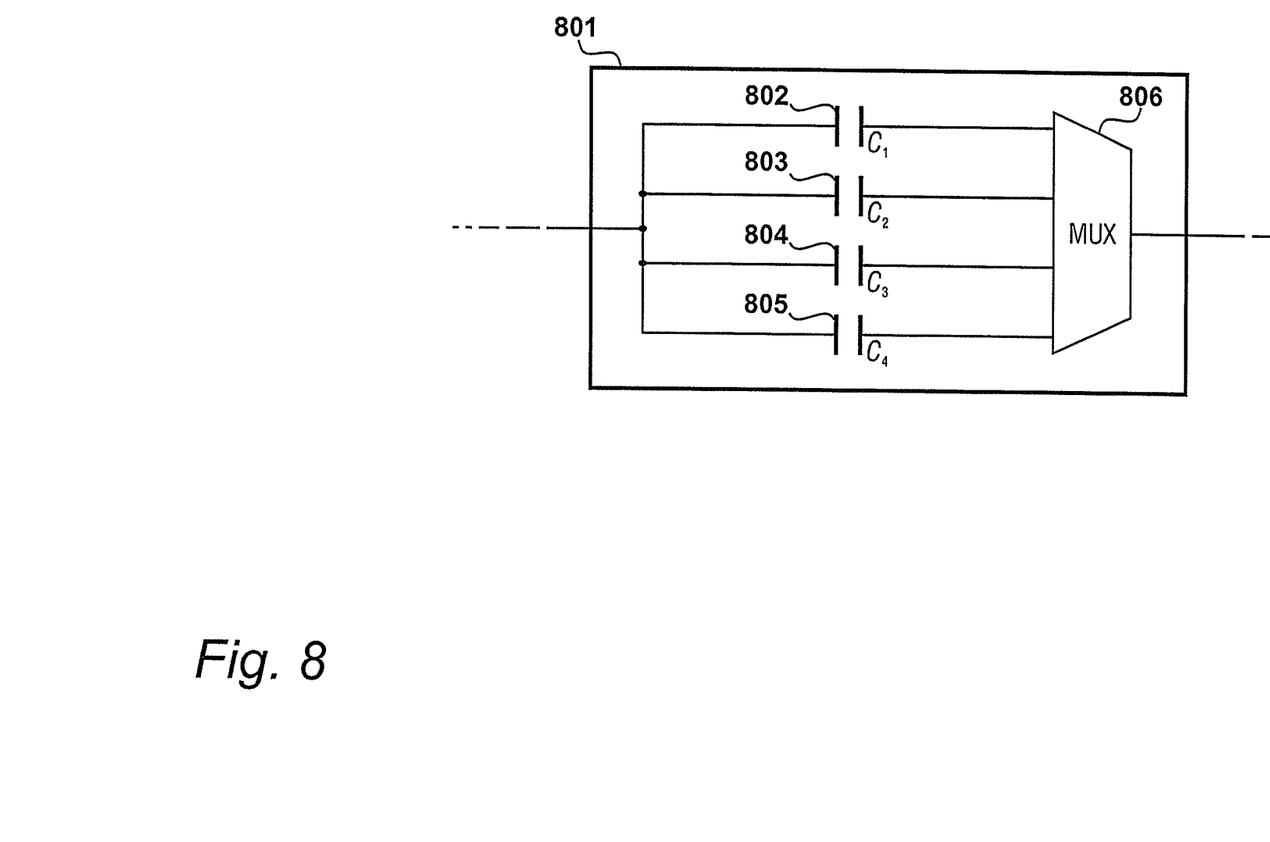
FIG. 8 shows a dominant-pole compensation circuit used in certain embodiments of the present invention.

FIG. 8

As previously described with reference to FIGS. 5 and 6, embodiments of the present invention include a compensation circuit (526 or 619) in the feedback loop of the output stage operational amplifier (518 or 618). The role of the compensation circuit is to implement a dominant pole, in order to guarantee stability of the system. Due to the wide-ranging gain that could be adopted by an amplifier constructed in accordance with the principles of the present invention, some embodiments can benefit from an adaptable compensation circuit. Such a proposal is illustrated in FIG. 8, identifying a compensation circuit 801 that can be employed in the structures of FIGS. 5 and 6.

In this example, four capacitors 802, 803, 804 and 805 are provided in parallel. Each capacitor has a different capacitance $C_1$, $C_2$, $C_3$ and $C_4$ respectively. In an exemplary implementation, capacitor 802 could have a capacitance of 10 picofarads, capacitor 803 a capacitance of 22 picofarads, capacitor 804 a capacitance of 100 picofarads, and capacitor 805 a capacitance of 470 picofarads. A multiplexer 806 is included to implement selection of which capacitor should be used to establish a dominant pole, and selects a suitable capacitor in accordance with the gain level selected for the overall structure, which can be digitally controlled in a similar way to the DACs. As will be appreciated by those skilled in the art, different capacitances will serve to establish dominant poles at different frequencies, thus allowing the tuning of the location of the dominant pole in the system to be at a frequency such that 0 decibels of gain is achieved before a −180 degree phase shift. This therefore ensures stability of the system at a wide range of possible gain levels.

I claim:

1. An amplifier for amplifying a differential audio signal having a first part and a second part, said amplifier having common-mode rejection and digital gain control, and comprising:

a first current source configured to supply a constant level of current to a first current path;

a second current source configured to supply a constant level of current to a second current path;

an input stage comprising:
 a first transistor having a first control input to receive said first part of the differential audio signal, and configured to modulate the current in said first current path in response to said first part, and
 a second transistor having a second control input to receive said second part of the differential audio signal, and configured to modulate the current in said second current path in response to said second part,
 to produce an amplified differential signal defined by the difference in currents in said first current path and said second current path;

an output stage configured to produce an output signal by amplifying said amplified differential signal; and a feedback stage comprising:
 a third transistor having a third control input to receive said output signal, and configured to modulate the current in said first current path in response to said output signal,
 a fourth transistor having a fourth control input to receive an inverse of said output signal, and configured to modulate the current in said second current path in response to an inverse of said output signal, so as to provide a degree of feedback to said input stage, and
 at least one multiplying digital-to-analog converter connected with at least one of said third control input and said fourth control input, and which is configured to provide attenuation that determines a degree to which the current in said first current path and the current in said second current path are modulated by said feedback stage.

2. The amplifier of claim 1, further comprising a direct current servo connected with said third control input or said fourth control input to remove direct current offset.

3. The amplifier of claim 1, wherein the first transistor is a first bipolar junction transistor and the second transistor is a second bipolar junction transistor, each having a base, an emitter and a collector, and wherein the base of the first bipolar junction transistor is said first control input and the base of the second bipolar function transistor is said second control input.

4. The amplifier of claim 3, further comprising an input-stage shunting resistance connected between the emitters of the first bipolar junction transistor and the second bipolar junction transistor.

5. The amplifier of claim 1, wherein said output stage includes a differential amplifier, having a non-inverting input connected with said first current path and an inverting input connected with said second current path for receiving said amplified differential signal.

6. The amplifier of claim 5, wherein the differential amplifier is an operational amplifier having a negative feedback path.

7. The amplifier of claim 6, wherein the negative feedback path of said operational amplifier includes a dominant pole compensator to encourage stability.

8. The amplifier of claim 7, wherein said dominant-pole compensator includes a plurality of capacitors, each one of which defines a pole frequency for a particular gain range.

9. The amplifier of claim 1, configured to receive balanced input signals, and comprising a first multiplying digital-to-analog converter and a second multiplying digital-to-analog converter as said at least one multiplying digital-to-analog converter, wherein said first multiplying digital-to-analog converter is connected with said third control input, and said a second multiplying digital-to-analog converter in combination with an inverter are connected with the fourth control input.

10. The amplifier of claim 9, wherein:
the third transistor is a first field effect transistor and the fourth transistor is a second field effect transistor, each having a gate, a source and a drain;
the gate of said first field effect transistor is said third control input; and
the gate of said second field effect transistor is said fourth control input.

11. The amplifier of claim 10, further comprising a feedback-stage shunting resistance connected between the drains of the first field effect transistor and the second field effect transistor.

12. The amplifier of claim 1, wherein:
the first current path includes a first current mirror and the second current path includes a second current mirror; and
said first current mirror and said second current mirror are connected between said input stage and said feedback stage.

13. The amplifier of claim 1, wherein said at least one multiplying digital-to-analog converter includes a digital control interface for receiving a digital word, and said at least one multiplying digital-to-analog converter is configured to adjust its level of attenuation based upon the digital word received from the digital control interface.

14. A mixing console including a differential input terminal for receiving a differential audio signal produced by an audio transducer, a digital gain controller for allowing an operator of the mixing console to control the gain applied to said differential audio signal, and the amplifier of claim 13, wherein:
in response to receiving input from the operator selecting a selected gain level, said digital gain controller is configured to provide, to the digital control interface in the at least one multiplying digital-to-analog converter, a digital word corresponding to said selected gain level.

15. The mixing console of claim 14, forming part of one of:
an audio recording system and
an audio broadcast system.

16. The amplifier of claim 1, forming part of a microphone pre-amplifier.

17. A method of controlling a gain applied during amplification to a differential audio signal, said method comprising the steps of:
(i) supplying a constant level of current to a first current path and a second current path;
(ii) controlling, by a first transistor, the current in said first current path in response to a first part of said differential audio signal received at a first control input of said first transistor, and controlling, by a second transistor, the current in said second current path in response to a second part of said differential audio signal received at a second control input of said second transistor;
(iii) amplifying a difference between the current in said first current path and the current in said second current path to produce an output signal;
(iv) generating a first feedback control signal by attenuating said output signal using a first multiplying digital-to-analog converter, and generating a second feedback control signal by inverting and attenuating said output signal using a second multiplying digital-to-analog converter;
(v) generating a degree of feedback by controlling the current in said first current path using a third transistor in response to said first feedback control signal received at a third control input of said third transistor, and controlling the current in said second current path using a fourth transistor in response to said second feedback control signal received at a fourth control input of said fourth transistor.

18. The method of claim 17, further comprising the step of:
(vi) removing any direct current offset in said output signal using a direct current servo connected with the third control input or the fourth control input.

19. The method of claim 17, wherein:
the first multiplying digital-to-analog converter has $2^n$ attenuation levels;
the second multiplying digital-to-analog converter has $2^n$ attenuation levels; and
stepping of attenuation alternates between the first multiplying digital-to-analog converter and the second multiplying digital-to-analog converter, thereby providing $2^{n+1}$ attenuation levels.

* * * * *